United States Patent [19]

Nakamura

[11] 3,721,914

[45] March 20, 1973

[54] DIFFERENTIAL AMPLIFIER HAVING BALANCED CURRENT FLOW

[75] Inventor: Hajime Nakamura, Kita Nishiogi, Suginami-ku, Tokyo, Japan

[73] Assignee: Sansui Electric Co., Ltd., Tokyo, Japan

[22] Filed: March 25, 1971

[21] Appl. No.: 128,083

[30] Foreign Application Priority Data

March 27, 1970 Japan ................................45/25461

[52] U.S. Cl. ........................330/25, 330/13, 330/28, 330/30 D

[51] Int. Cl. ..............................H03f 3/18, H03f 3/68

[58] Field of Search ........330/30 D, 30 R, 13, 17, 25, 330/28

[56] References Cited

UNITED STATES PATENTS

| | | | |
|---|---|---|---|
| 3,493,879 | 2/1970 | Stanley | 330/30 D X |
| 3,077,566 | 2/1963 | Vosteen | 330/30 D UX |
| 3,506,926 | 4/1970 | Shoemaker | 330/30 D |

*Primary Examiner*—Roy Lake
*Assistant Examiner*—James B. Mullins
*Attorney*—Flynn & Frishauf

[57] ABSTRACT

A two-stage differential amplifier wherein the supply of voltage and current to a first stage differential amplifier circuit is controlled and a direct current from the output side of a second stage differential amplifier circuit is fed back to said first stage circuit.

2 Claims, 3 Drawing Figures

DIFFERENTIAL AMPLIFIER HAVING BALANCED CURRENT FLOW

BACKGROUND OF THE INVENTION

This invention relates to a transistorized two-stage direct coupled type differential amplifier.

With a differential amplifier circuit, it is generally required that the properties of a pair of transistors acting as a differential amplifier, for example, the degree $h_{FE}$ of amplifying direct current and the base-emitter voltage $V_{BE}$, be matched within a certain range. The reason is that if such properties are not well matched, then the bias currents of the respective transistors will be thrown out of balance to prevent a differential amplifier circuit consisting thereof from being properly operated. Where, therefore, there is manufactured a differential amplifier, it is necessary to pick out from among a large number of transistors a pair in which the aforementioned properties closely approximate each other. This limits the amount of production and undesirably results in increased cost, presenting a problem particularly in quantity manufacture.

SUMMARY OF THE INVENTION

It is accordingly the object of this invention to provide a two-stage direct coupled type differential amplifier capable of acting as a differential amplifier by simple adjustment even if there are used a pair of transistors having different properties.

A two-stage direct coupling type differential amplifier according to this invention can attain the aforementioned object by means for controlling the voltage and current supplied to a first stage differential amplifier and additional D.C. feedback means for feeding back an output from a second stage differential amplifier to the input side of the first stage differential amplifier.

DESCRIPTION OF THE PREFERRED EMBODIMENTS

Figure 1:
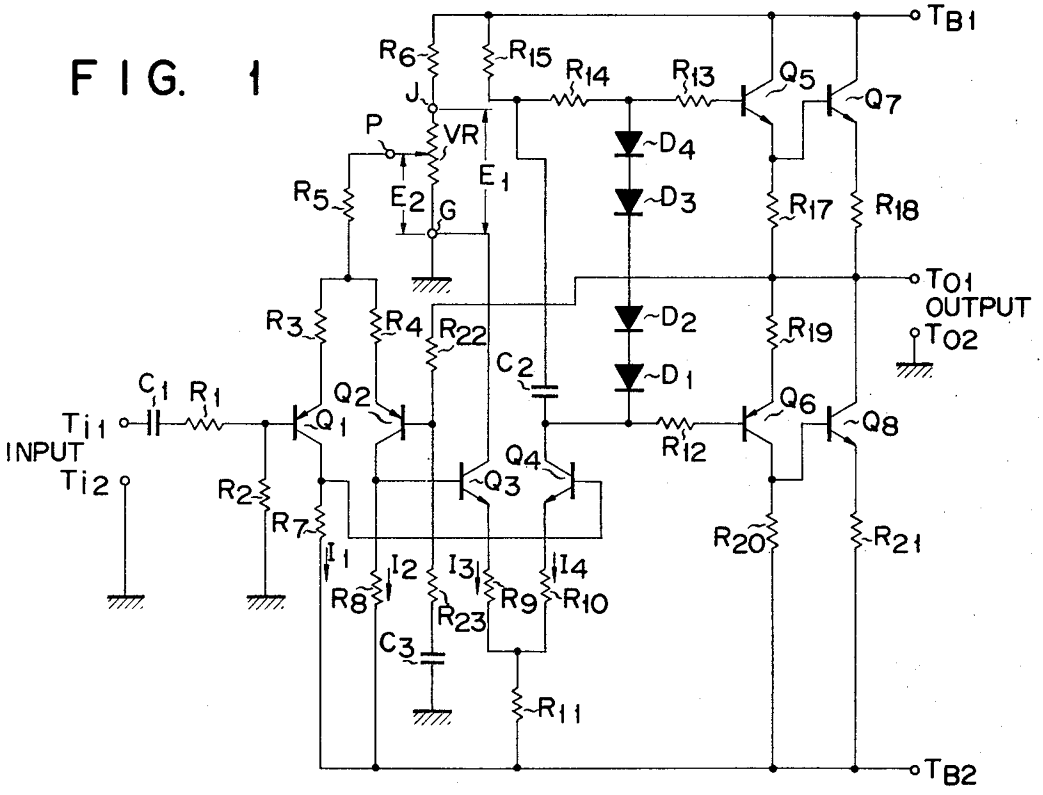
FIG. 1 is a circuit diagram of a differential amplifier according to an embodiment of this invention.

FIG. 1 relates to the case where there is applied the differential amplifier of this invention in a quasi complementary symmetry type power amplifier. Reference characters $Q_1$ and $Q_2$ represent PNP type transistors constituting a first stage differential amplifier circuit and $Q_3$ and $Q_4$ NPN type transistors constituting a second stage differential circuit. $T_{i1}$ and $T_{i2}$ are input terminals impressed with audio frequency signals and $T_{o1}$ and $T_{o2}$ denote output terminals. Of these terminals, $T_{i2}$ and $T_{o2}$ are grounded. $T_{B1}$ and $T_{B2}$ are power source terminals. Across $T_{B1}$ and $T_{o2}$ as well as across $T_{o2}$ and $T_{B2}$ are supplied direct currents having the same absolute value but opposite polarities The input terminal $T_{i1}$ is connected to the base of the transistor $Q_1$ through an input coupling capacitor $C_1$ and bleeder resistor $R_1$, said base being grounded through a bleeder resistor $R_2$. The emitters of the transistors $Q_1$ and $Q_2$ are jointly connected to one end of a resistor $R_5$ through resistors $R_3$ and $R_4$ respectively. The other end of the resistor $R_5$ is connected to the movable terminal P of a variable resistor VR, which is intended to regulate the emitter voltage of the transistors $Q_1$ and $Q_2$, is grounded at one end G and connected at the other end J to the power source terminal $T_{B1}$ through a resistor $R_6$. The collectors of the transistors $Q_1$ and $Q_2$ are connected to the other power source terminal $T_{B2}$ through resistors $R_7$ and $R_8$ respectively. The base of the transistor $Q_2$ is grounded through a resistor 23 and capacitor $C_3$. The base of the transistor $Q_3$ is directly connected to the collector of the transistor $Q_2$, and the base of the transistor $Q_4$ is directly connected to the collector of the transistor $Q_1$. The emitters of the transistors $Q_3$ and $Q_4$ are jointly connected to one end of a resistor $R_{11}$ through resistors $R_9$ and $R_{10}$ respectively, the other end of said resistor $R_{11}$ being connected to the power source terminal $T_{B2}$. The collector of the transistor $Q_3$ is grounded and the collector of the transistor $Q_4$ is connected to a PNP type transistor $Q_6$ through a protection resistor $R_{12}$, and also to the base of the NPN type transistor $Q_5$ through silicon diodes $D_1$, $D_2$, $D_3$ and $D_4$ intended for both supply of bias voltage and temperature compensation as well as through a protection resistor $R_{13}$. The transistors $Q_5$ and $Q_6$ constitute a complementary symmetry type phase splitter circuit. The contact (i.e., connection point) of a resistor $R_{13}$ and diode $D_4$ is connected to the power source terminal $T_{B1}$ through resistors $R_{14}$ and $R_{15}$, the contact of which in turn is connected to the collector of the transistor $Q_4$ through a capacitor $C_2$ intended for prevention of abnormal oscillations. The collector of the transistor $Q_5$ is connected to the power source terminal $T_{B1}$ and the emitter thereof is connected to the output terminal $T_{o1}$ through a resistor $R_{17}$ and also directly connected to the base of a PNP type power transistor $Q_7$, whose collector is connected to the power source terminal $T_{B1}$ and whose emitter is connected to the output terminal $T_{o1}$ through a resistor $R_{18}$. The emitter of the transistor $Q_6$ is connected to the output terminal $T_{o1}$ through a resistor 19 and the collector thereof is connected to the other power source terminal $T_{B2}$ through a resistor $R_{20}$ and also directly connected to the base of an NPN power transistor $Q_8$, whose collector is directly connected to the output terminal $T_{o1}$ and whose emitter is connected to the other power source terminal $T_{B2}$ through a resistor $R_{21}$. The output terminal $T_{o1}$ is connected to the base of the transistor $Q_2$ through a resistor $R_{22}$, which constitutes a D.C. feedback circuit. A circuit consisting of the resistors $R_{22}$ and $R_{23}$ and capacitor $C_3$ constitutes a negative feedback circuit with respect to A.C. signals.

There will now be described the operation of a power amplifier arranged as described above. The description first relates to the operation of a two-stage direct coupled type amplifier by reference to FIGS. 1 and 2. With the voltage across the terminals J and G of the variable resistor VR designated as $E_1$ and the voltage across the terminals P and G thereof as $E_2$, let it be assumed that there flow currents $I_1$, $I_2$, $I_3$ and $I_4$ through the resistors $R_7$, $R_8$, $R_9$ and $R_{10}$ respectively.

When the movable terminal P of the variable resistor VR is so set as to have its voltage $E_2$ reduced to 0 volt ($E_2 = 0$), the transistors $Q_1$ and $Q_2$ are in an off state because their emitter and base voltages are zero. Accordingly, the transistors $Q_3$ and $Q_4$ are also in an off state, that is, all currents $I_1$, $I_2$, $I_3$ and $I_4$ are zero. Therefore, the transistors $Q_5$, $Q_6$, $Q_7$ and $Q_8$ are also in an inoperative state, permitting no passage of current through the resistor $R_{22}$.

When the movable terminal P of the variable resistor VR is so set as to be impressed with progressively increasing voltage ($0<E_2<E_1$), then there occur different voltages between the base and emitter of the transistor $Q_1$ whose base is grounded through the resistor $R_2$, so that said transistor $Q_1$ is rendered conducting. Since the base of the transistor $Q_2$ is not directly grounded, its base voltage is temporarily drawn near its emitter voltage, so that said transistor $Q_2$ is eventually put into operation, though its base-emitter voltage is smaller than that of the transistor $Q_1$. Since, in this case, the transistor $Q_1$ has a higher base-emitter voltage than the transistor $Q_2$, the former has a larger collector current than the latter, that is, $I_1$ is greater than $I_2$. Accordingly, the transistor $Q_4$ has a higher base voltage than the transistor $Q_3$ and is actuated. At this time, the collector current of said transistor $Q_4$ passes through the resistors $R_{15}$ and $R_{14}$ and diodes $D_4$, $D_3$, $D_2$ and $D_1$ to impress the bases of the transistors $Q_5$ and $Q_6$ with bias voltage, so that both transistors $Q_5$ and $Q_6$ and in consequence the transistors $Q_7$ and $Q_8$ are energized. To the base of the transistor $Q_2$ is conducted current through the resistor $R_{22}$ to increase its collector current $I_2$. When the collector currents $I_1$ and $I_2$ of the transistors $Q_1$ and $Q_2$ are made equal, then the collector currents $I_3$ and $I_4$ of the transistors $Q_3$ and $Q_4$ also become equal.

When the voltage at point P is raised, there flows larger current through the resistor $R_{22}$ to balance the magnitudes of current passing through the transistors $Q_5$, $Q_6$, $Q_7$ and $Q_8$, resulting in further increase in the collector current $I_2$ of the transistor $Q_2$ and in consequence the emitter current $I_3$ of the transistor $Q_3$.

Figure 2:
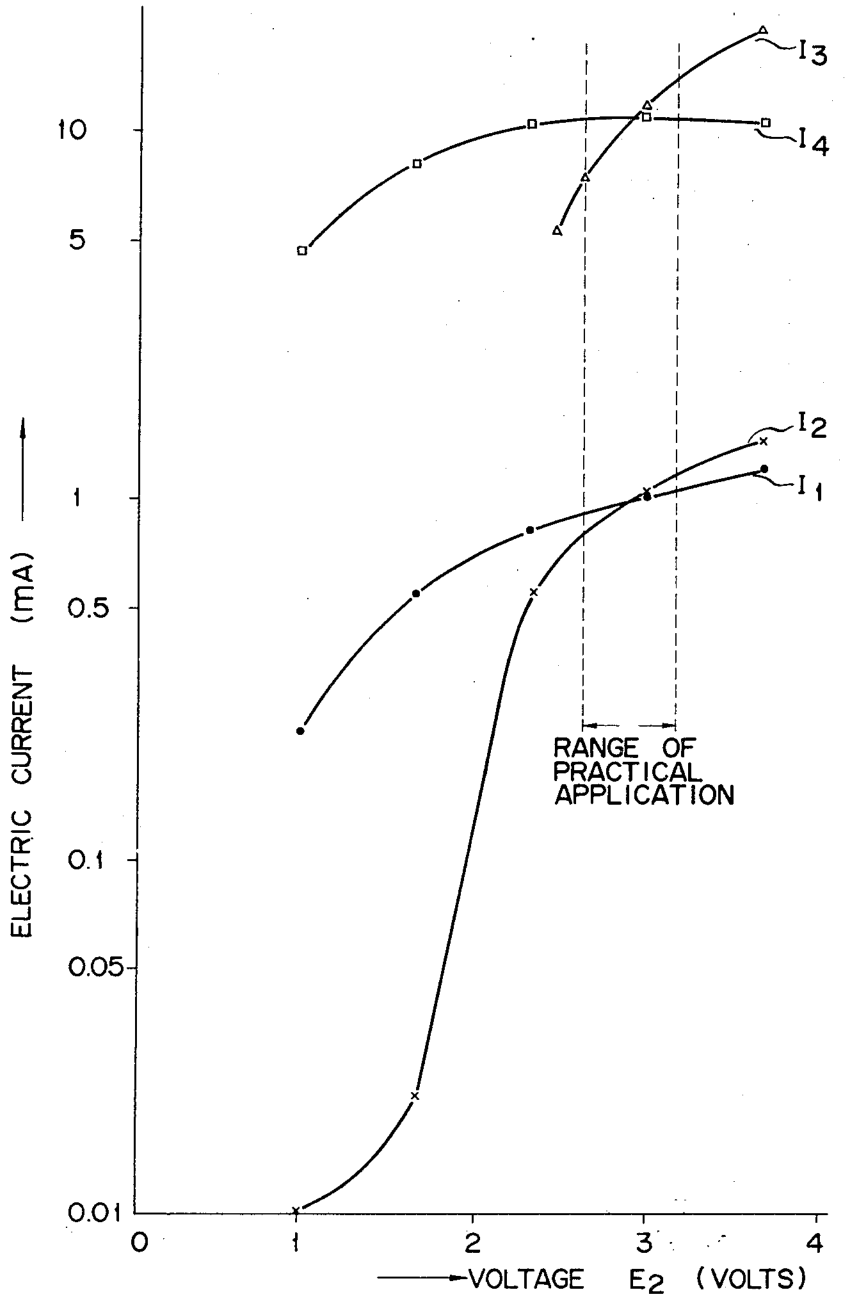
FIG. 2 graphically presents the measured values of current passing through part of the circuit of FIG. 1.

FIG. 2 graphically presents measured values associated with the aforementioned cycle of operation. In said measurement, the variable resistor VR consisted of a 3 KΩ type to adjust the emitter voltages of the transistors $Q_1$ and $Q_2$ and another circuit element consisted of an amplifier of substantially the same type as a common combination of two-stage differential amplifier and quasi complementary symmetry type power amplifier, so that detailed description of the constant of said circuit elements is omitted. Referring to FIG. 2, the abscissa represents voltage $E_2$ across the terminals P and G, and the ordinate the magnitutes of current passing through the individual branched circuits. As apparent from FIG. 2, when the voltage $E_2$ across the terminals P and G takes a certain value, the collector currents $I_1$ and $I_2$ of the transistors $Q_1$ and $Q_2$ constituting the first stage differential amplifier circuit are made equal. At this time, the emitter currents $I_3$ and $I_4$ of the transistors $Q_3$ and $Q_4$ constituting the second stage differential amplifier circuit are also made equal. Accordingly, the first and second stage differential circuits fully display a function as such. It will be apparent that even when the currents $I_1$ and $I_2$, as well as those $I_3$ and $I_4$, do not exactly agree with each other, the aforesaid differential amplifier circuit well serves the practical purpose even in a region of unbalance indicated in dotted lines in FIG. 2.

There will now be further described the operation of a power amplifier used in the circuit of FIG. 1, particularly with respect to A.C. input signals. Now let it be assumed that both differential amplifiers are in a balanced condition due to the aforesaid adjustment and that the resistors $R_2$ and $R_{22}$ are so controlled as to cause the voltage across the output terminals $T_{o1}$ and $T_{o2}$ to be reduced to zero when the input signal is zero. The A.C. signal supplied across the input terminals $T_{i1}$ and $T_{i2}$ is amplified by the transistor $Q_1$ to be drawn out from its collector as output having an opposite phase to said input signal. Since the base of the transistor $Q_2$ is grounded with respect to A.C. signal through the resistor $R_{23}$ and capacitor $C_3$, the input signal is supplied to the emitter of the transistor $Q_2$ through the resistors $R_3$ and $R_4$ to be drawn out from its collector in the form of a minor signal having the same phase as the input signal supplied to the transistor $Q_1$. Namely, the collector output of the transistor $Q_1$ and that of the transistor $Q_2$ have opposite phases. The signal conducted from the collector of the transistor $Q_1$ is amplified by the transistor $Q_4$ to be drawn out from the collector of the latter transistor $Q_4$. The signal supplied from the collector of the transistor $Q_2$ is drawn out from the collector of the transistor $Q_3$. The positive half cycle of the output from the collector of the transistor $Q_4$ is amplified by the transistor $Q_5$ and the negative half cycle of said output is amplified by the transistor $Q_6$. These outputs are further amplified by the transistors $Q_7$ and $Q_8$ respectively, so that there is produced across the output terminals $T_{o1}$ and $T_{o2}$ an output having the same phase as the input signal. Part of the output generated at the output terminal $T_{o1}$ is fed back to the base of the transistor $Q_2$ through the resistor $R_{22}$ in the negative form because said output has an opposite phase to the collector output of a transistor $Q_1$. That is, the resistor $R_{22}$ acts as an A.C., as well as a D.C., feed back circuit.

Figure 3:
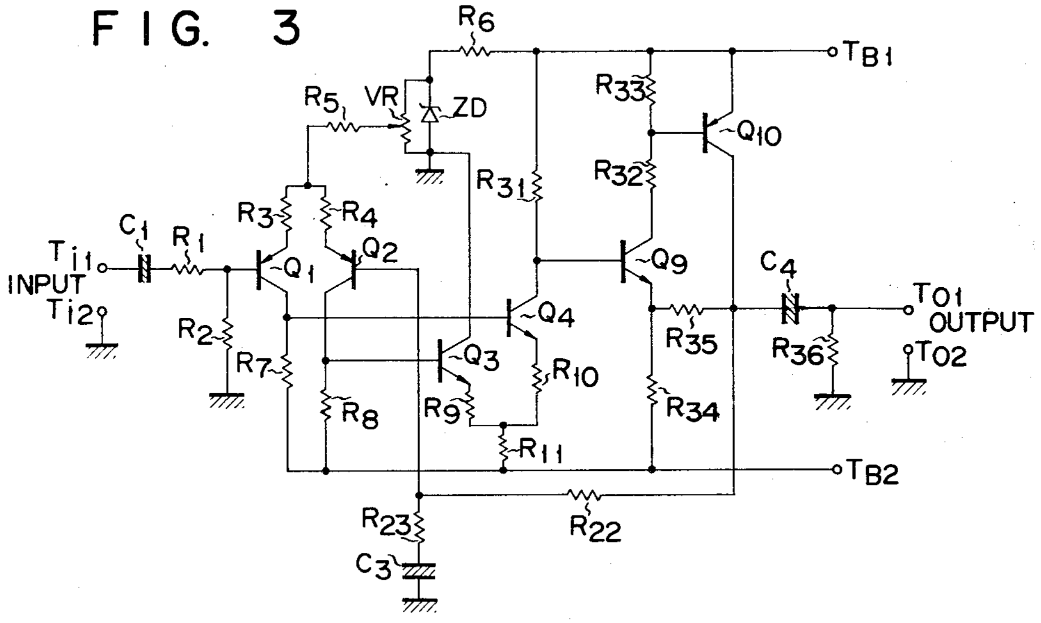
FIG. 3 is a circuit diagram of a differential amplifier according to another embodiment of the invention.

The foregoing description relates to the case where the two-stage differential amplifier of this invention was used in a quasi complementary symmetry type power amplifier. It will be apparent that the invention is also applicable in any other type of power amplifier. Such application, for example, is illustrated in FIG. 3 wherein the differential amplifier circuit is employed in the known Darlington type power amplifier. The same parts of FIG. 3 as those of FIG. 1 are denoted by the same numerals. The operation of said Darlington type power amplifier is already well known and the operation of the two-stage differential amplifier circuit of this invention shown in FIG. 3 is the same as that of FIG. 1 and description thereof is omitted. The only difference between the embodiment of FIG. 3 and that of FIG. 1 is that the former has a Zener diode disposed between the fixed terminals of the variable resistor VR. Said Zener diode is intended to stabilize the emitter voltages of the first and second transistors $Q_1$ and $Q_2$. The resistor $R_{22}$ constituting a D.C. feedback circuit is connected to the collector of a transistor $Q_{10}$ from which there is drawn out the output of the power amplifier, as well as to the base of the second transistor $Q_2$.

In this specification there is described a two-stage differential amplifier circuit using NPN or PNP type transistors as described above. It will be apparent that this invention is also applicable to two-stage differential amplifier circuits using an active semiconductor element such as a field effect transistor.

What I claim is:

1. A two-stage direct coupled type differential amplifier comprising:

a first stage differential amplifier circuit including first and second transistors connected in a differential circuit configuration, each of said first and second transistors having base, emitter, and collector electrodes;

a second stage differential amplifier circuit including third and fourth transistors connected in a differential circuit configuration, each of said third and fourth transistors having base, emitter, and collector electrodes, the base electrode of said third transistor being directly connected to the collector electrode of said second transistor, and the base electrode of said fourth transistor being directly connected to the collector electrode of said first transistor;

an input terminal connected to the base electrode of said first transistor;

a first power supply terminal connected to the emitter electrodes of said first and second transistors;

a second power supply terminal connected to the collector electrodes of said first and second transistors and the emitter electrodes of said third and fourth transistors; and means for substantially balancing the current flow of tee first and the second transistors, and of the third and the fourth transistors, said balancing means comprising:

a D.C. feedback circuit connected between the collector electrode of said fourth transistor and the base electrode of said second transistor; and emitter bias voltage regulating means including a bleeder-type variable resistance element having a pair of fixed resistance terminals and a variable resistance tap intermediate said fixed terminals, one of said fixed resistance terminals being coupled to said first power supply terminal, the other of said fixed resistance terminals being coupled to a source of potential and said variable resistance tap being coupled to the emitter electrodes of the first and second transistors; and a Zener diode connected between said pair of fixed resistance terminals of said variable resistance element for regulating the common emitter bias voltage of the first and second transistors.

2. The amplifier according to claim 1 wherein said other fixed resistance terminal of said variable resistor is coupled to ground potential.

* * * * *